(12) United States Patent
Werrbach

(10) Patent No.: US 6,266,423 B1
(45) Date of Patent: Jul. 24, 2001

(54) MICROPHONE OUTPUT LIMITER

(75) Inventor: Donn R. Werrbach, Glendale, CA (US)

(73) Assignee: Aphex Systems, Ltd., Sun Valley, CA (US)

( * ) Notice: Subject to any disclaimer, the term of this patent is extended or adjusted under 35 U.S.C. 154(b) by 0 days.

(21) Appl. No.: 09/060,678

(22) Filed: Apr. 15, 1998

(51) Int. Cl.[7] ........................................ H03G 3/00
(52) U.S. Cl. ........................ 381/108; 381/106; 381/120
(58) Field of Search ............................. 381/94.1, 104, 381/107, 108, 106, 120

(56) References Cited

U.S. PATENT DOCUMENTS

| | | | |
|---|---|---|---|
| 4,112,384 | * | 9/1978 | Buchberger ........................... 330/141 |
| 4,479,239 | * | 10/1984 | Rhines .................................... 381/72 |
| 4,799,107 | * | 1/1989 | Stoughton et al. ................... 358/169 |
| 5,737,432 | * | 4/1998 | Werrbach ............................. 381/94.1 |

* cited by examiner

Primary Examiner—Forester W. Isen
Assistant Examiner—Brian Tyrone Pendleton
(74) Attorney, Agent, or Firm—Thomas I. Rozsa; Tony D. Chen; Jerry Fong

(57) ABSTRACT

A microphone output limiter which detects the amplitude of a microphone and produces a control signal which lowers the microphone's impedance when the amplitude of the audio signal exceeds a preselected threshold level. The output signal is detected at the output of the microphone or it may be detected at the output of a later pre-amplifier stage. Once a control signal is generated it is coupled to a variable impedance device which produces a shunt load impedance across the output of the microphone thereby lowering its impedance. The microphone, as well as the variable impedance device, may be coupled through impedance converters in order to facilitate component matching.

23 Claims, 6 Drawing Sheets

MICROPHONE OUTPUT LIMITER

BACKGROUND OF THE INVENTION

1. Field of the Invention

The present invention pertains to the field of signal processors. More particularly, the present invention pertains to the field of electroacoustic transducers, such as microphones, and the amplification of their output signals. Even more specifically, the present invention pertains to the field of automatic control of the output signal level of electroacoustic transducers.

2. Description of the Prior Art

In the field of electronic audio devices, the use of microphones usually includes microphone pre-amplifiers which are used to boost up the low output voltage of the microphone to a higher operating level. A problem occurs when the dynamic range of the microphone output exceeds the dynamic range of the associated pre-amplifier, a case which commonly occurs. For example, if the sound level near the microphone should exceed a certain maximum level, the output voltage of the microphone may remain undistorted but will be high enough to overload the pre-amplifier causing distortion of the pre-amplifier output signal. A typical case where this problem occurs is in live sound reinforcement where a performer may sing or speak very loudly, causing distortion. It would be desirable to have means to automatically prevent pre-amplifier overload whenever the microphone output would exceed the maximum input level of the pre-amplifier.

In prior art, there are mainly two methods used to deal with this problem. First, an operator can ride gain on the pre-amplifier and manually readjust the pre-amplifier gain to avoid overload as necessary in reaction to ongoing events. The principal disadvantage of this method is the need for a skilled operator dedicated to the duty.

A second approach to deal with the problem is to configure the pre-amplifier into two stages. In this case it is desirable to have a first stage with a relatively low gain first stage, which allows more input headroom. The second stage adds the required gain boost to make up for the reduced gain of the first stage, but also includes an automatic gain control (AGC) limiter function with a preselected threshold level to prevent overdriving subsequent circuitry. Whenever the microphone output signal rises above the threshold level, the limiter's gain is automatically reduced proportionately. In this way the pre-amplifier is prevented from clipping the output signal. This method is effective until the input stage finally reaches an overload level above which the limiter function can no longer prevent any overload distortion. In the sound studio and live recording sessions, the first and second stages just described are usually comprised of separate and independent units. The stages usually involve a separate microphone pre-amplifier stage, set to a relatively low gain and a separate adjustable limiter stage having the necessary make-up gain. A few microphone pre-amplifiers are commercially available which integrate the two stages. The principal disadvantage of this two-stage approach is a significant noise floor penalty, that is the thermal noise is amplified along with the signal, roughly on the order of the net input headroom improvement which is gained. It would be desirable to have means to extend the input dynamic range of a microphone pre-amplifier, through the use of some sort of limiter function, which does not cause a noise floor penalty.

At this point it may be useful to mention that it seems possible to construct a microphone pre-amplifier having electronically variable front-end gam which could be operated with an AGC limiter function, thus avoiding the need for a second stage limiter and the consequential noise floor penalty. However, this type of "automatically controllable" microphone pre-amplifier which may retain the high quality attributes of conventional top-grade pre-amplifiers has not yet been produced and seems unlikely to be practical with presently known technology.

SUMMARY OF THE INVENTION

The present invention solves the problem mentioned above without the need to automatically control the pre-amplifier gain, and thus eliminates any need for a pre-amplifier electronic gain control feature.

According to the present invention a microphone is provided with an output signal at its output terminals which are connected directly to the input of an audio pre-amplifier. A controllable variable impedance device is coupled to the output terminals of the microphone in order to load its output terminals with an impedance load. The variable device acts to combine its impedance with the output impedance of the microphone to form a shunt load impedance. The variable impedance device is in turn controlled by a threshold level detector which is coupled to the input of the pre-amplifier. By varying the shunt load impedance the microphone's output signal will automatically be maintained at a preselected level as it passes into the pre-amplifier's input circuit. In operation the microphone will transform various sounds, having different frequencies and amplitude, into a directly proportional electronic signal at its output terminals. This signal is immediately detected by the threshold level detector that will generate a control signal once the microphone's output signal has exceeded a preselected limit or threshold. The control signal is then coupled to a variable impedance device, which creates a variable impedance shunt load impedance across the microphone's output terminals. In effect, a negative feedback circuit is created that will respond to rises in the level of the microphone's output signal by producing an offsetting decrease in the total impedance across the microphone's terminals. In this way the output of the microphone and the input to the pre-amplifier will be automatically maintained within certain limits. Of course, it is a matter of design choice whether the feedback signal to the input of the detector comes from the input of the pre-amplifier or the output of the pre-amplifier.

In alternative embodiments, an impedance matching transformer may be inserted in the circuit at various points. It may be used as a step-up or step-down transformer or simply to match the various input impedances of different components.

It would be useful and desirable to have an automatic limiting device to avert and prevent the input overloading of a microphone pre-amplifier over a significant dynamic range above its normal overload threshold. The device should act smoothly as a limiter. Ideally, the device should also be relatively simple and low in cost, and should work satisfactorily with a wide variety of conventional microphones and microphone pre-amplifiers without significant modifications to either the microphone or the pre-amplifier. It would also be desirable for the automatically limiting device to introduce no appreciable noise penalties.

It is one objective of the present invention to provide a means of automatically averting the input overload of a microphone pre-amplifier over a significant margin of dynamic range above its normal input overload threshold.

It is another objective of the present invention to provide a means which functions smoothly as a limiter without creating sudden, discretely switched steps of gain or attenuation.

It is yet another objective of the present invention to function effectively with conventional microphones and microphone pre-amplifiers and be relatively simple and inexpensive to implement.

Although the present invention is herein described in relation to microphones and pre-amplifiers of the types commonly found in the audio field, it is anticipated by the inventor that the teachings of the invention should well apply to many other fields where various types of electroacoustic transducers are used, for example such as in Sonar and other ultrasonic equipment.

The novelty, usefulness and scope of the present invention will become more apparent through the following detailed description taken together with the drawings and the appended claims.

BRIEF DESCRIPTION OF THE DRAWINGS

Referring particularly to the drawings for the purpose of illustration only and not limitation, there is illustrated.

DETAILED DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

The present invention is a Microphone Output Limiter, hereinafter sometimes referred to as an "MOL". The purpose of the present invention is to provide a means to control the output signal of a microphone before the signal is applied to the input of a pre-amplifier, the major benefit being to protect the pre-amplifier from overload. A unique and novel feature of the present invention is that it involves the microphone's output impedance as a key element of the limiting process.

Figure 1:
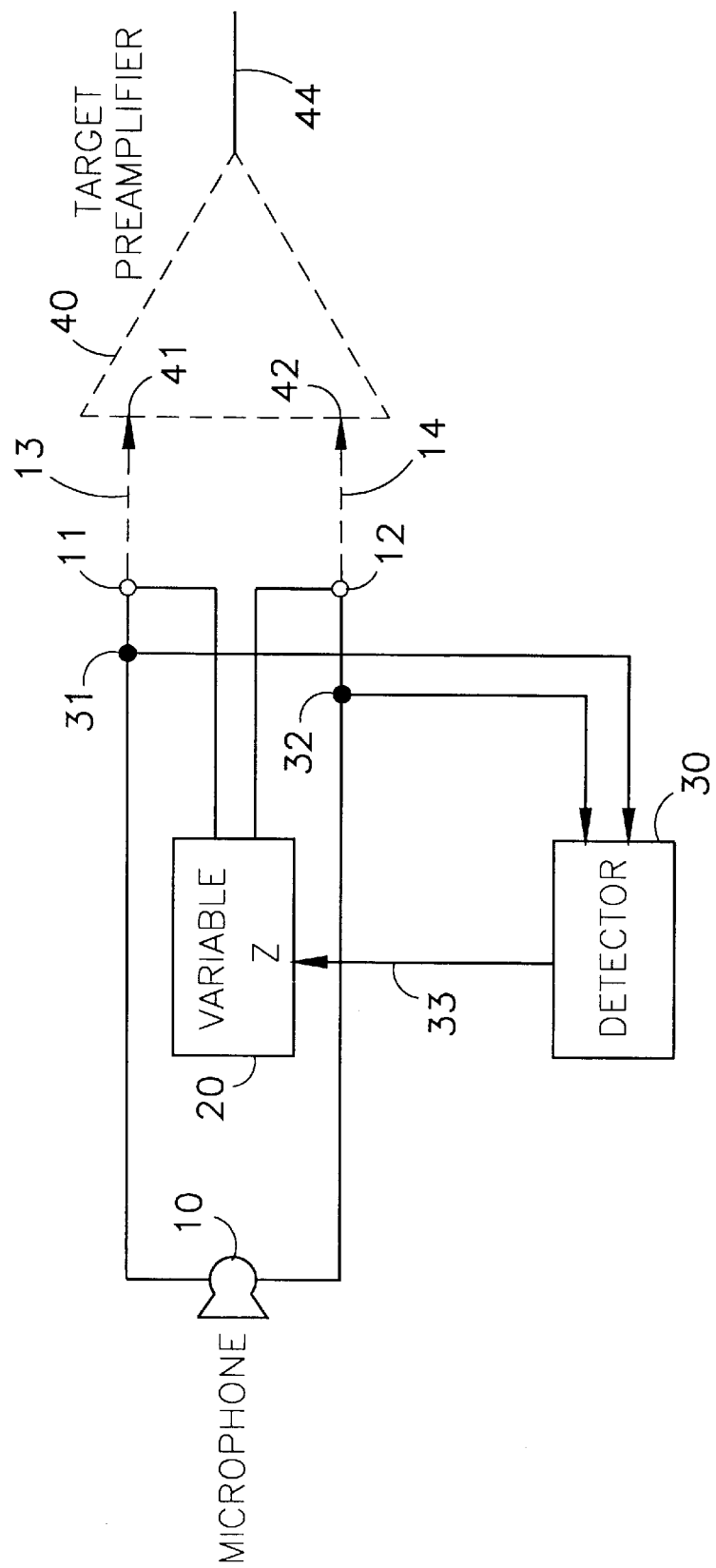
FIG. 1 is a basic configuration of the present invention showing a microphone output limiter in block diagram form.

The essential parts of the MOL are illustrated in the block diagram of FIG. 1. The operation of the present invention or MOL, shown in its basic form in FIG. 1, is quite simple.

Referring now to FIG. 1, there is shown a microphone 10 whose output signal appears across terminals 11 and 12. A controllable variable impedance device 20 is coupled between terminals 11 and 12 for the purpose of loading the output signal of the microphone with variable impedance. Detector 30, a threshold level detector, is coupled to receive the microphone's output signal from terminals 11 and 12 and generate a control signal on line 33 suitable for controlling the impedance of variable impedance device 20. The control signal on line 33 is coupled to the variable impedance device 20 to control the impedance presented across terminals 11 and 12 according to the function of the detector 30. The microphone output signal across terminals 11 and 12 is shown coupled by dashed lines 13 and 14 to the respective terminals of a target pre-amplifier 40 which, in the context of FIG. 1, is shown for clarification purposes only and is not necessarily a part of the present invention, but does represent an audio pre-amplifier that will be protected from being overloaded by the present invention MOL.

The operation of the present invention MOL, according to FIG. 1, is as follows. In the field it is well known that all microphones possess characteristic output impedance. For example, typical professional microphone output impedances can range from 150 to 600 ohms. In operation, variable impedance device 20 combines the output impedance of microphone 10 to form a shunt-loaded variable attenuator for the microphone's output voltage appearing across terminals 11 and 12. By varying the shunt load impedance provided by the variable impedance device 20, the microphone's output voltage may be readily adjusted. Detector 30 causes the impedance of variable impedance device 20 to become increasingly smaller as the microphone's output voltage across terminals 11 and 12 crosses above the detection threshold of detector 30. This forms a feedback limiter function, which will attenuate and thereby limit the microphone's output voltage whenever it meets and exceeds the threshold of detector 30. In the broadest form and scope, the limited output signal at terminals 11 and 12 may be considered the final output signal of the present invention MOL.

The full purpose and benefits of the present invention can be realized when the microphone output of terminals 11 and 12 is coupled to the input of a microphone pre-amplifier 40, which may be a conventional type of microphone pre-amplifier, and the limit threshold of detector 30 is set to a point equal to or less than the maximum undistorted input level of the microphone pre-amplifier 40. The microphone pre-amplifier 40 may be described as a "target" pre-amplifier whose main purpose is to amplify the microphone's output signal to a useful operating level available at pre-amplifier output 44, and whose input overload limit is being protected by the present invention, but is not otherwise necessarily related to the definition and scope of the present invention. The obvious benefit of the present invention MOL as shown in FIG. 1 is that, as long as the variable impedance device 30 can be made to have a small enough shunting impedance relative to the microphone's output impedance, the microphone's output signal can be limited over a wide dynamic range above the target pre-amplifier 40's input overload threshold, and the target pre-amplifier will remain protected from overloading. What is not so obvious is that, since the present invention MOL is acting as a shunt to the microphone's output impedance, the thermal noise introduced into the microphone's output signal by the MOL is not increased from what would be present without the MOL. In fact, the thermal noise is reduced by the presence of the MOL because the thermal noise is a function of the paralleled resistance value of the microphone's output impedance and the limiter's shunt impedance. The paralleled resistances are always smaller than the microphone's output resistance alone, generating a smaller amount of thermal noise with the MOL present than when it is omitted.

Several convenient and practical variations to the MOL described in FIG. 1 have been developed or are anticipated by the inventor and will next be described. In addition, examples of circuits which can be used to realize useful embodiments of the present invention MOL, including examples of the variable impedance device 20 and the detector 30, will be described to enable one skilled in the art to constrict a model of the present invention.

Figure 2:
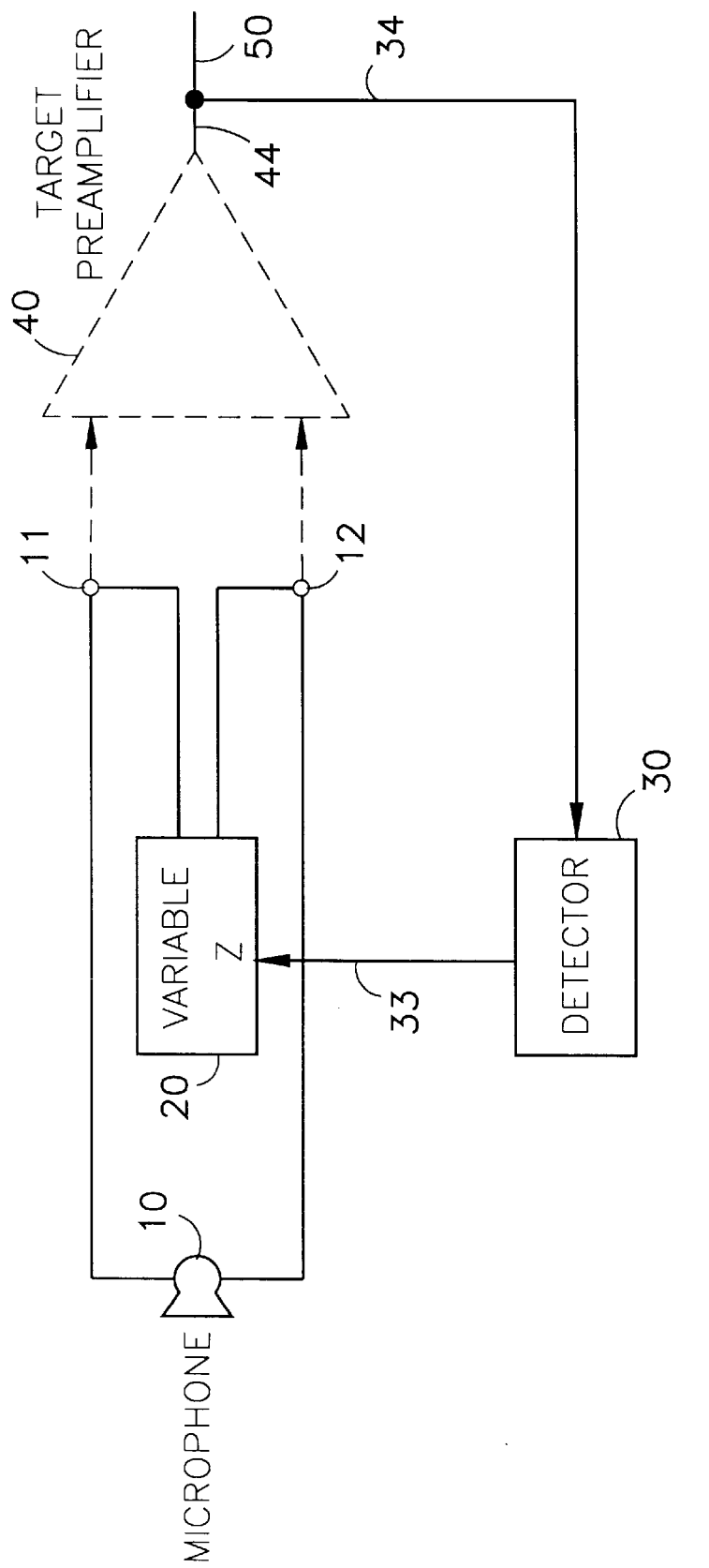
FIG. 2 is a block diagram of an alternative configuration of the present invention showing a microphone output limiter with a detector sensing the output of a pre-amplifier.

FIG. 2 illustrates a variation of the present invention MOL where are shown all the elements of FIG. 1, but arranged to include the target pre-amplifier 40 within the detector's feedback loop. Referring to FIG. 2, there is shown a microphone 10 whose output signal appears across terminals 11 and 12. A controllable variable impedance device 20 is coupled between terminals 11 and 12 for the purpose of loading the output signal of the microphone with a variable impedance. Target pre-amplifier 40, which may be a conventional microphone pre-amplifier, is coupled to receive the microphone output signal across terminals 11 and 12 for the purpose of amplifying the microphone output signal to a useful operating level and providing an amplified output signal 50. Detector 30, a threshold level detector, is coupled to receive the output signal 50 of target pre-amplifier 40 and generate a control signal on line 33 suitable for controlling the impedance of variable impedance device 20. The control signal 5 on line 33 is coupled to the variable impedance device 20 to control the impedance presented across terminals 11 and 12 according to the function of the detector 30.

The operation of the present invention MOL, according to FIG. 2, is as follows. All microphones possess a characteristic output impedance. For example only, typical microphone output impedances range from 150 to 600 ohms. The variable impedance 20 combines with the output impedance of the microphone 10 to form a shunt-loaded variable attenuator for the microphone's output voltage appearing across terminals 11 and 12. By varying the shunt load impedance provided by the variable impedance device 20, the microphone's output voltage may be readily adjusted. Detector 30, a threshold level detector, causes the impedance of variable impedance device 20 to become increasingly smaller as the target pre-amplifier 40's output voltage 50 crosses above the threshold level of detector 30. This forms a feedback limiter function which will attenuate and thereby limit the microphone's output voltage whenever the target pre-amplifier 40's output level exceeds the threshold amplitude determined by the detector 30.

The main advantage of the MOL of FIG. 2 over that of FIG. 1 is that the threshold of detector 30 may be set to a fixed point just below the clipping amplitude of the output 50 of target pre-amplifier 40, and thereby protect the target pre-amplifier 40 from input overload regardless of the gain setting of the target pre-amplifier. The MOL of FIG. 1 would need the threshold of the detector 30 to be adjusted inversely as a function of the gain of the target pre-amplifier 40 in order to prevent clipping of the target pre-amplifier's output signal 50. While both the methods of FIG. 1 and FIG. 2 have been shown to work well, the version of FIG. 1 is described mainly to illustrate the broadest scope of present invention while the version of FIG. 2 is presently preferred.

The scope and contemplation of the present invention MOL is principally a method and is not limited to the use of any specific circuit or electronic component teclmology to realize the variable impedance device 20. For example only, and not to limit the present invention, the presently preferred variable impedance device suitable for the present invention in high quality audio applications is the Light Dependent Resistor (LDR). In the configuration shown by FIGS. 1 and 2, the variable impedance device 20 directly shunts the microphone output impedance. In order to achieve at least 20 dB of limiting headroom above threshold, the variable impedance device 20 must be capable of dropping its impedance to less than one-tenth the microphone's output impedance, or typically less than 15 ohms. Commercially available LDR's, that can presently achieve this low resistance, tend to be rather nonlinear and can introduce harmonic distortion to the microphone's output signal when used to construct the variable impedance device 20. This is not necessarily a limitation to the present invention MOL because it is theoretically possible to construct an LDR having suitable characteristics by resistance paralleling commercially available LDR devices of higher minimum resistance but which are adequately linear, or by designing a new LDR specifically for the purpose. However, the use of impedance transformation to be shown forthwith allows the variable impedance device 20 to operate at higher, more practical impedances, and still follow all the teachings and remain well within the scope and contemplation of the present invention MOL.

Figure 3:
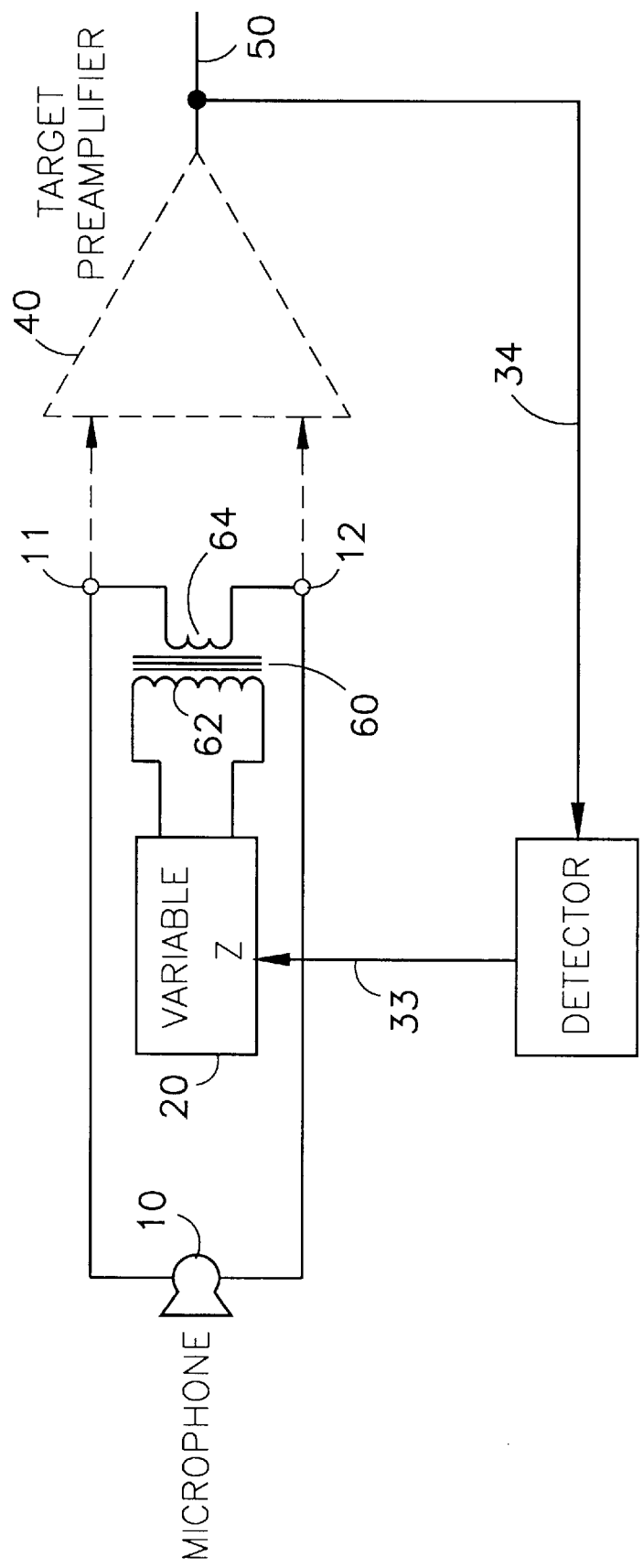
FIG. 3 is another alternative configuration of the present invention showing a microphone output limiter coupled through an impedance matching transformer to the input of a pre-amplifier in block diagram form.

FIG. 3 illustrates another variation of the present invention MOL using impedance transformation. It will be seen that FIG. 3 is identical to FIG. 1 except for the addition of transformer 60. The first winding 62 of transformer 60 is coupled to shunt the variable impedance device 20 while the second winding 64 of transformer 60 is coupled to shunt the microphone output appearing at terminals 11 and 12. The operation of the MOL of FIG. 3 is exactly as described for FIG. 1 except as follows.

For the purposes of the present invention, transformer 60 is an impedance converter. The impedance presented by the variable impedance device 20 to the first winding 62 is converted to a different (higher or lower) impedance felt across the second winding 64. The impedance transformation follows standard transformer theory as the square of the turns ratio. Therefore, the impedance of the variable impedance device 20 can be made to operate in any desired range of magnitude by properly defining the turns ratio of the transformer 60 in relationship to the output impedance of microphone 10. For example, if the microphone impedance is 150 ohms, and it is desired to allow for 20 dB of limiting headroom, the effective shunt impedance across terminals 11 and 12 needs to be approximately 15 ohms. If the lowest impedance of variable impedance device 20 is desired to be 150 ohms, then an impedance transformation of 10 is required of transformer 60 which equates to a transformer turns ratio of the square root of ten with the smaller number of turns appearing at 62. It should be obvious that the transformer 60 can be operated as a step-up or a step-down transformer depending upon the desired relationship between the magnitude of the microphone 10 output impedance and the desired magnitude of the variable impedance device 20.

Figure 4:
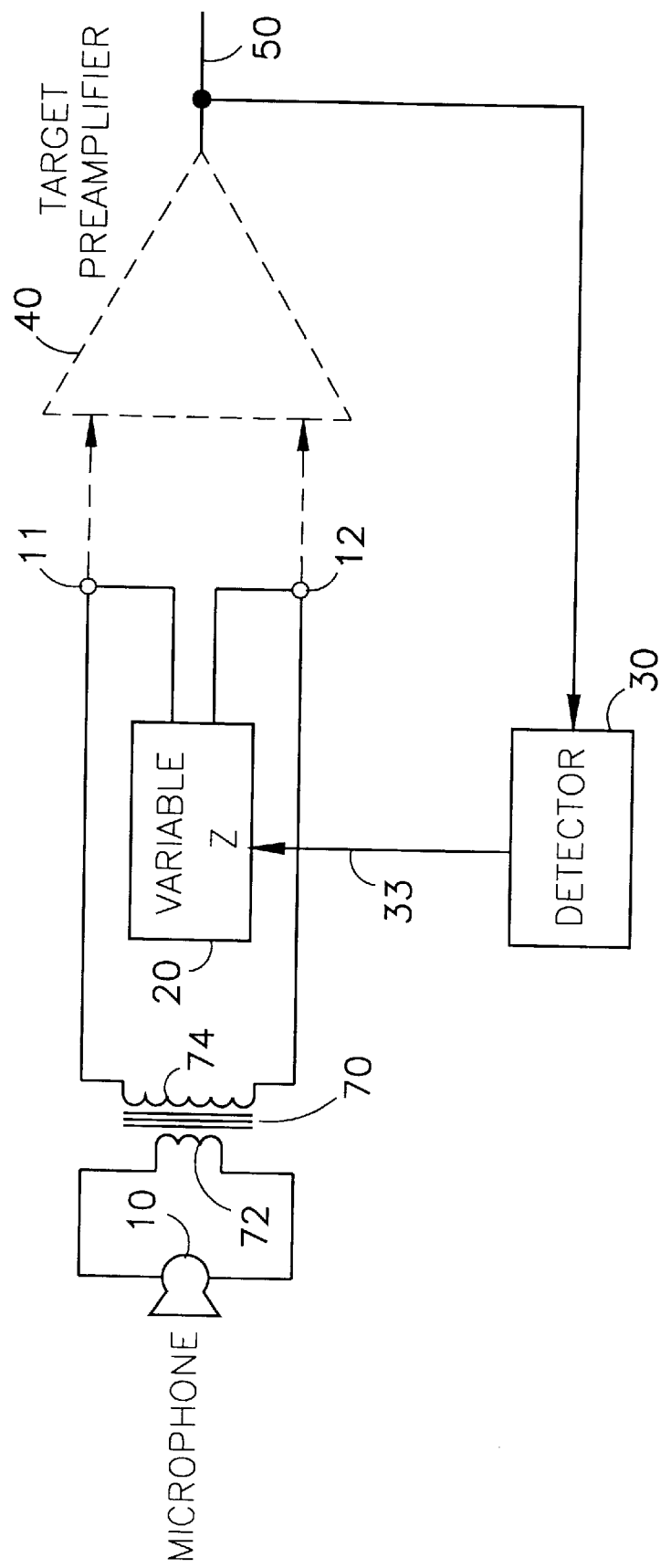
FIG. 4 is another alternative configuration of the second embodiment of the present invention showing a microphone output limiter coupled to the input of a microphone through an impedance matching transformer in block diagram form.

FIG. 4 illustrates yet another variation using impedance transformation, which remains within the scope and contemplation of the present invention MOL. It will be seen that FIG. 4 is identical to FIG. 2 except for the addition of transformer 70. The first winding 72 of transformer 70 is coupled to receive the output of microphone 10 while the second winding 74 of transformer 70 is coupled to shunt the variable impedance device across terminals 11 and 12. The operation of the MOL of FIG. 4 is exactly as described for FIG. 2 except as follows.

For the purposes of the present invention, transformer 70 is an impedance converter. The impedance presented by microphone 10 to the first winding 72 is converted to a different (higher or lower) impedance felt across the second winding 74. The impedance transformation follows standard transformer theory as the square of the turns ratio. Therefore, the impedance of the variable impedance device 20 can be made to operate in any desired range of magnitude by properly defining the turns ratio of the transformer 70 in relationship to the output impedance of microphone 10. For example, if the microphone impedance is 150 ohms, and it is desired to allow for 20 dB of limiting headroom, the effective shunt impedance across terminals 11 and 12 needs to be approximately 15 ohms. If the lowest impedance of variable impedance device 20 is desired to be 150 ohms, then an impedance transformation of 10 is required of transformer 70 which equates to a transformer turns ratio of the square root of ten, with the smaller number of turns appearing at 72. It should be obvious that the transformer 70 can be operated as a step-up or a step-down transformer depending upon the desired relationship between the magnitude of the microphone 10 output impedance and the desired magnitude of the variable impedance device 20. A possible advantage to the method of FIG. 4 is that the gain of target pre-amplifier 40 can be reduced by the voltage gain of transformer 70 if transformer 70 is used in the step-up mode, i.e., 72 is smaller than 74, which is usually the case in practice. Many conventional microphone pre-amplifiers utilize an input step-up transformer. When such a pre-amplifier is used in the function of the target pre-amplifier 40 of FIG. 4, it is contemplated to be within the scope of the present invention that the self same input transformer of the target pre-amplifier may supply the function of transformer 70.

Figure 5:
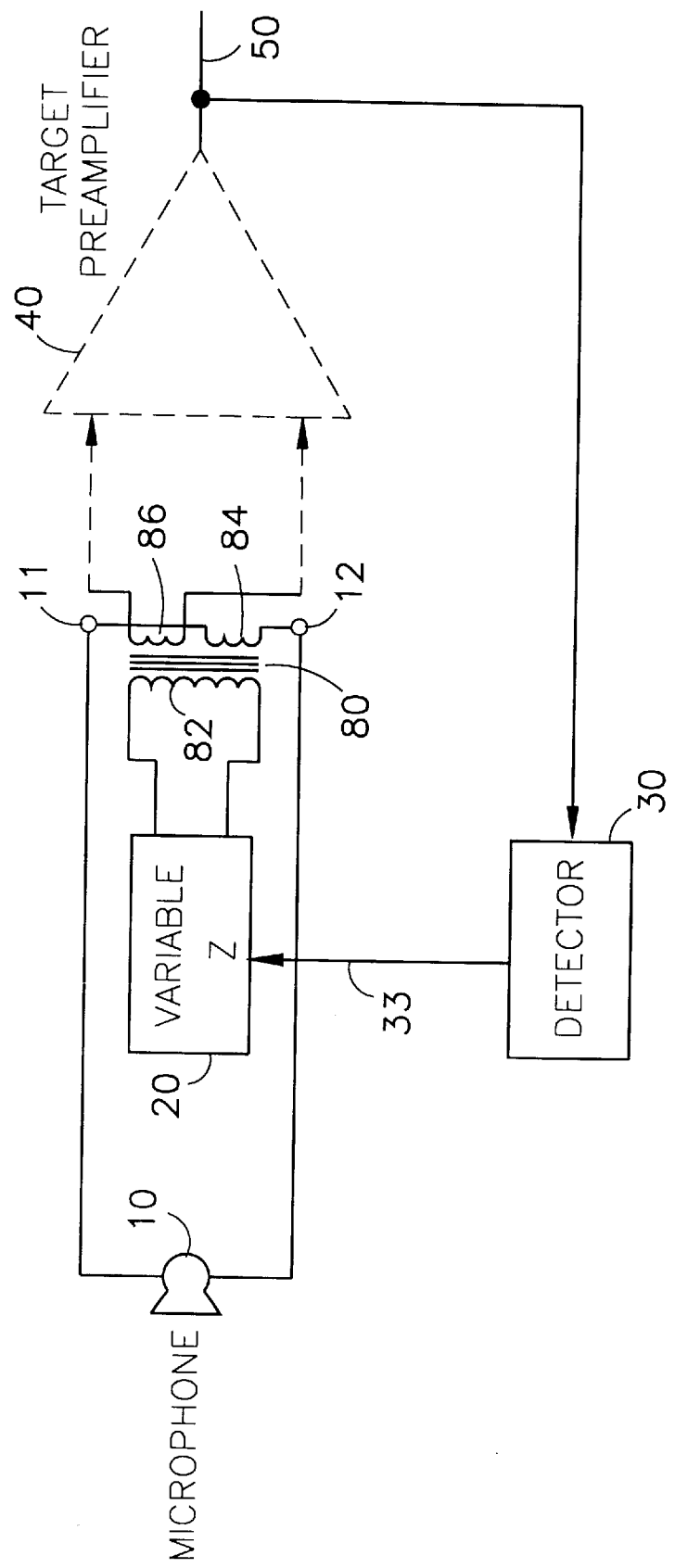
FIG. 5 is another configuration of the present invention showing a microphone output limiter coupled to a pre-amplifier through a three winding impedance matching transformer in block diagram form.

Yet another variation contemplated of the present invention MOL is shown in FIG. 5. This variation functions exactly as that of FIG. 4 except as follows. There is shown a three winding transformer 80 having the three windings labeled 82, 84, and 86. Winding 84 is coupled to receive across terminals 11 and 12 the output voltage of microphone 10. Winding 86 is coupled to the input of the target pre-amplifier 40. Through normal transformer coupling, the microphone output signal is thus coupled to the pre-amplifier input. The turns ratio of 84 to 86 may be any suitable ratio. For example only, and without limiting the present invention, the turns ratio of 84 to 86 may be 1:5 which represents a 14 dB voltage step-up typical of many standard microphone pre-amplifier input transformers. Winding 82 is coupled across the variable impedance device 20. Through normal transformer coupling, winding 86 transforms the impedance of the variable impedance 20 as a load across terminals 11 and 12. The turns ratio of 82 to 84 creates the same relationship between the microphone's output impedance and the operational impedance of the variable impedance 20 as previously described for the circuit of FIG. 4. The main advantage of the method of FIG. 5 is that a single transformer can be used to facilitate impedance transformation for both the target pre-amplifier's input requirements and the desired operating impedance of the variable impedance device 20 of the present invention MOL.

For convenience, the impedance transformation variations of the present invention which were shown in FIGS. 3, 4, and 5, and associatively described, illustrated the detector 30 being coupled to the output of the target pre-amplifier 40. That is the presently preferred arrangement of the present invention, and the principles and advantages of this arrangement of the detector 30 were described for the method of FIG. 2. However, it is anticipated and contemplated that the detector 30 of FIGS. 3, 4 and 5 may also be coupled to receive the microphone 10 output signal across the terminals 11 and 12 as previously described for FIG. 1. It should also be clear that the microphone 10 output signal at terminals 11 and 12 also appears, in some specific proportions depending upon the turns ratios, across all the other transformer windings and that the input to the detector 30 can therefore be coupled to receive the signal appearing across any of the windings, so long as the detector's threshold is determined appropriately, and remain well within the scope of the present invention.

Figure 6:
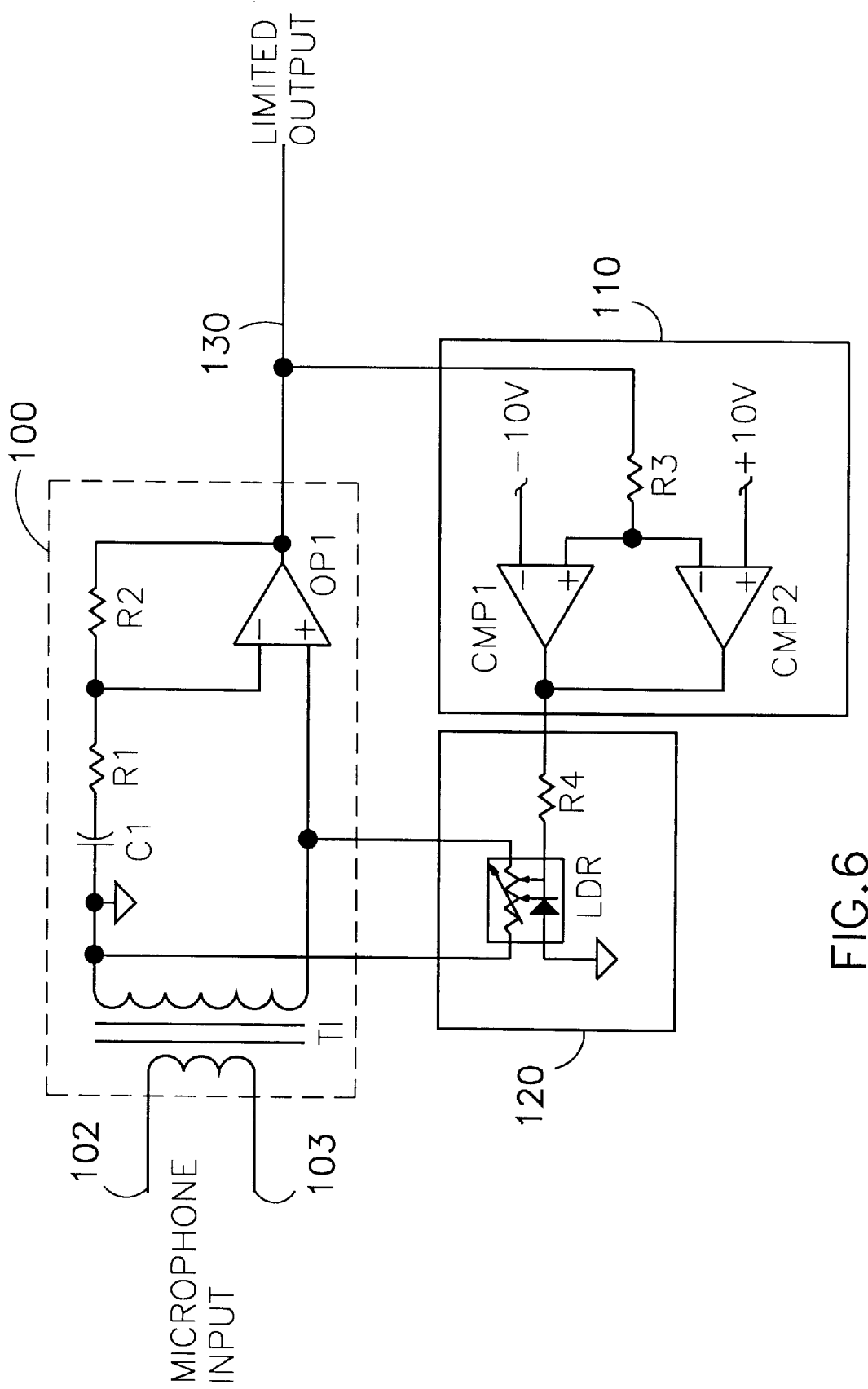
FIG. 6 is schematic drawing of a circuit embodying the present invention.

FIG. 6 illustrates a simplified and not necessarily optimized embodiment of the present invention which nevertheless adequately serves to demonstrate the invention. It should be understood that there are many other ways to construct the present invention MOL and remain within the scope and contemplation of the invention.

Referring to FIG. 6, there is shown a microphone pre-amplifier 100 circuit enclosed within the dashed box. This pre-amplifier may be considered equivalent to the target pre-amplifier of FIGS. 1 through 5. The pre-amplifier 100 comprises an input transformer T1, an opamp OP1, and several other components configured in a very conventional amplifier circuit. Since such circuits are so widely known and understood, a detailed description of the pre-amplifier 100 will not herein be given. It will be assumed that a microphone having an output impedance of approximately 150 to 250 Ohms is connected to the pre-amplifier input. The pre-amplifier output 130 is coupled to the input of the peak detector 110 comprised of two comparators CMP1 and CMP2 and resistor R3 in a conventional window comparator configuration having +10 and −10 volts as the window references. The peak detector 110 of this circuit is equivalent to detector 30 of FIGS. 1 through 5. The output of the peak detector 110 is coupled to a light dependent resistance (LDR) assembly 120. LDR 120 is equivalent to the variable impedance device of FIGS. 1 through 5. It will be noticed that the circuit of FIG. 6 resembles the method of FIG. 4. In the description of FIG. 4 it was contemplated that the impedance transformer of the present invention may be the self same input transformer of the target pre-amplifier, and the circuit of FIG. 6 is configured in that way. The circuit of FIG. 6 works as follows.

Whenever the output 130 of the pre-amplifier 100 exceeds +10 or −10 volts, the detector 110 outputs a negative logical state voltage, which is coupled to LDR 120 through the current limiting resistor R4. This causes the LED within LDR 120 assembly to light up, which in turn causes the light dependent resistance within LDR 120 assembly to quickly reduce in value. Operating under the principles taught in FIG. 4, the light dependent resistance shunts the secondary winding of T1, thereby attenuating the microphone's output voltage and causing the output of the pre-amplifier 100 to limit at the threshold of ten volts amplitude. The natural light pulse integrating property of LDR 120 and its light "memory" provide a simple and convenient attack and release timing, making it smooth enough to serve in the limiting function. For example only, the part values of FIG. 6 may be as follows. OP1 is NE5532, R1 and R2 are 220K Ohms, R3 is 249 Ohms, C1 is 220 uF, CMP1 and CMP2 are LM393, R3 is 1K Ohms, R4 is 150 Ohms, LDR1 is Vactec VTL5C9, and T1 is a microphone input transformer having a turns ratio of 1:5.

It is emphasized that the circuit shown in FIG. 6 is not intended as a limitation to the embodiment of the present invention microphone output limiter. It has been shown how the present invention can be implemented in numerous ways. There are undoubtedly many more circuits including various means for generating a control signal to create a feedback loop to the variable impedance device which can be adapted to follow the teachings of the present invention. Therefor, the present invention is not limited to the examples, which are shown here. In addition, the teachings of the present invention can be implemented in digital processing with equal validity.

Defined in detail, the present invention is a microphone output limiter, comprising: (a) a microphone having a pair of output terminals; (b) a pre-amplifier having a pair of input terminals operably connected to the pair of microphone output terminals; (c) a threshold level detector having a pair of input lines, each separately connected to the pre-amplifier input terminals, the threshold level detector having an output line; (d) a variable impedance device having an input circuit connected to the threshold level detector output line and a pair of output lines operably connected to the pre-amplifier input terminals; and (e) the variable impedance device producing a shunt load impedance at the pair of input terminals of the pre-amplifier in response to a control signal from the threshold level detector, which control signal is generated whenever the microphone generates a signal that exceeds a preselected level set within the threshold level detector.

Defined broadly, the present invention is a microphone output limiter, comprising: (a) a microphone having a pair of output terminals; (b) a pre-amplifier having a pair of input terminals operably connected to the pair of microphone output terminals, and an output circuit; (c) a threshold level detector having an input line connected to the pre-amplifier output circuit, the threshold level detector having an output line; (d) a variable impedance device having an input circuit connected to the threshold level detector output line and a pair of output lines operably connected to the pre-amplifier input terminals; and (e) the variable impedance device producing a shunt load impedance at the pair of input terminals of the pre-amplifier in response to a control signal from the threshold level detector, which control signal is generated whenever the pre-amplifier output circuit generates a signal that exceeds a preselected level set within the threshold level detector.

Defined alternatively in detail, the present invention is a microphone output limiter, comprising: (a) a microphone having a pair of output terminals; (b) a pre-amplifier having a pair of input terminals operably connected to the pair of microphone output terminals and an output circuit; (c) a threshold level detector having an input line connected to the pre-amplifier output circuit, the threshold level detector having an output line; (d) a variable impedance device having an input circuit connected to the threshold level detector output line, and a pair of output lines; (e) an impedance converter having a first winding connected to the pair of output lines of the variable impedance device and a second winding connected to the pair of input terminals of the pre-amplifier; and (f) the variable impedance device producing a shunt load impedance at the pair of input terminals of the pre-amplifier through the impedance converter in response to a control signal from the threshold level detector, which control signal is generated whenever the pre-amplifier output circuit generates a signal that exceeds a preselected level set within the threshold level detector.

Defined further alternatively in detail, the present invention is microphone output limiter, comprising: (a) a microphone having a pair of output terminals; (b) an impedance converter, having a first winding connected to the pair of output terminals of the microphone, and a second winding; (c) a pre-amplifier having a pair of input terminals operably connected to the second winding of the impedance converter, and an output circuit; (d) a threshold level detector having an input line connected to the pre-amplifier output circuit, the threshold level detector having an output line; (e) a variable impedance device having an input circuit connected to the threshold level detector output line and a pair of output lines and operably connected to the pre-amplifier input terminals; and the variable impedance device producing a shunt load impedance at the pair of input terminals of the pre-amplifier in response to a control signal from the threshold level detector, which control signal is generated whenever the pre-amplifier output circuit generates a signal that exceeds a preselected level set within the threshold level detector.

Defined further alternatively broadly, the present invention is a microphone output limiter, comprising: a microphone having a pair of output terminals; (b) an impedance converter having a first winding, a second winding connected to the pair of microphone output terminals, and a third winding; (c) a pre-amplifier having a pair of input terminals operably connected to the third winding of the impedance converter, and an output circuit; (d) a threshold level detector having an input line connected to the pre-amplifier output circuit, the threshold level detector having an output line; (e) a variable impedance device having an input circuit connected to the output line of the threshold level detector, and a pair of output lines connected to the first winding of the impedance converter; and (f) the variable impedance device producing a shunt load impedance at the pair of input terminals of the pre-amplifier through the impedance converter in response to a control signal from the threshold level detector, which control signal is generated whenever the pre-amplifier output circuit generates a signal that exceeds a preselected level set within the threshold level detector.

Defined further alternatively more broadly, the present invention is a microphone output limiter used in conjunction with a pre-amplifier for supplying a signal to an output circuit of the pre-amplifier, where the pre-amplifier also has an output circuit or generating an output signal, the microphone output limiter comprising: (a) a threshold level detector connected to the output circuit of the pre-amplifier for detecting the output signal and to generate a control signal whenever the output signal exceeds a preselected level; and (b) a variable impedance device operably connected to the threshold level detector for receiving the control signal to produce a shunt load impedance at the input circuit of the pre-amplifier.

Defined further alternatively even more broadly, the present invention is an output limiter for controlling a microphone signal level input to a pre-amplifier having an input circuit and an output circuit, the limiter comprising: (a) a threshold level detector connected to the output circuit of the pre-amplifier for detecting an output signal therefrom to generate a control signal whenever the output signal exceeds a preselected level; (b) a variable impedance device operably connected to the threshold level detector for receiving the control signal to produce a shunt load impedance; and (c) an impedance converter having at least two windings operably connected between the microphone and the pre-amplifier and also connected to the variable impedance device for accommodating the requirement of the input impedance of the input circuit of the pre-amplifier.

Of course the present invention is not intended to be restricted to any particular form or arrangement, or any specific embodiment disclosed herein, or any specific use, since the same may be modified in various particulars or relations without departing from the spirit or scope of the claimed invention hereinabove shown and described of which the apparatus shown is intended only for illustration and for disclosure of an operative embodiment and not to disclose all the various forms or modifications in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of the patent monopoly to be granted.

What is claimed is:

1. A microphone output limiter, comprising:
   a. a microphone having a pair of output terminals;
   b. a pre-amplifier having a pair of input terminals operably connected to said pair of microphone output terminals;
   c. a threshold level detector having a pair of input lines, each separately connected to said pre-amplifier input terminals, said threshold level detector having an output line;
   d. a variable impedance device having an input circuit connected to said threshold level detector output line and a pair of output lines operably connected to said pre-amplifier input terminals; and
   e. said variable impedance device producing a shunt load impedance at said pair of input terminals of said pre-amplifier in response to a control signal from said threshold level detector, which control signal is generated whenever said microphone generates a signal that exceeds a preselected level set within said threshold level detector.

2. The microphone output limiter as defined in claim 1 wherein said variable impedance device is a light dependent resistance assembly.

3. The microphone output limiter as defined in claim 1 wherein said threshold level detector is a peak detector comprised of two comparators in a conventional window comparator configuration.

4. The microphone output limiter as defined in claim 3 wherein said window comparator has +10 volt and −10 volt window references.

5. A microphone output limiter, comprising:
   a. a microphone having a pair of output terminals;
   b. a pre-amplifier having a pair of input terminals operably connected to said pair of microphone output terminals and an output circuit;
   c. a threshold level detector having an input line connected to said pre-amplifier output circuit, said threshold level detector having an output line;
   d. a variable impedance device having an input circuit connected to said threshold level detector output line, and a pair of output lines;
   e. an impedance converter having a first winding connected to said pair of output lines of said variable impedance device and a second winding connected to said pair of input terminals of said pre-amplifier; and
   f. said variable impedance device producing a shunt load impedance at said pair of input terminals of said pre-amplifier through said impedance converter in response to a control signal from said threshold level detector, which control signal is generated whenever said pre-amplifier output circuit generates a signal that exceeds a preselected level set within said threshold level detector.

6. The microphone output limiter as defined in claim 5 wherein said variable impedance device is a light dependent resistance assembly.

7. The microphone output limiter as defined in claim 5 wherein said threshold level detector is a peak detector comprised of two comparators in a conventional window comparator configuration.

8. The microphone output limiter as defined in claim 7 wherein said window comparator has +10 volt and −10 volt window references.

9. A microphone output limiter, comprising:
   a. a microphone having a pair of output terminals;
   b. an impedance converter, having a first winding connected to said pair of output terminals of said microphone, and a second winding;
   c. a pre-amplifier having a pair of input terminals operably connected to said second winding of said impedance converter, and an output circuit;
   d. a threshold level detector having an input line connected to said pre-amplifier output circuit, said threshold level detector having an output line;
   e. a variable impedance device having an input circuit connected to said threshold level detector output line and a pair of output lines and operably connected to said pre-amplifier input terminals; and
   f. said variable impedance device producing a shunt load impedance at said pair of input terminals of said pre-amplifier in response to a control signal from said threshold level detector, which control signal is generated whenever said pre-amplifier output circuit generates a signal that exceeds a preselected level set within said threshold level detector.

10. The microphone output limiter as defined in claim 9 wherein said variable impedance device is a light dependent resistance assembly.

11. The microphone output limiter as defined in claim 9 wherein said threshold level detector is a peak detector comprised of two comparators in a conventional window comparator configuration.

12. The microphone output limiter as defined in claim 11 wherein said window comparator has +10 volt and −10 volt window references.

13. A microphone output limiter, comprising:
   a. a microphone having a pair of output terminals;
   b. an impedance converter having a first winding, a second winding connected to said pair of microphone output terminals, and a third winding;
   c. a pre-amplifier having a pair of input terminals operably connected to said third winding of said impedance converter, and an output circuit;
   d. a threshold level detector having an input line connected to said pre-amplifier output circuit, said threshold level detector having an output line;
   e. a variable impedance device having an input circuit connected to said output line of said threshold level detector, and a pair of output lines connected to said first winding of said impedance converter; and,
   f. said variable impedance device producing a shunt load impedance at said pair of input terminals of said pre-amplifier through said impedance converter in response to a control signal from said threshold level detector, which control signal is generated whenever said pre-amplifier output circuit generates a signal that exceeds a preselected level set within said threshold level detector.

14. The microphone output limiter as defined in claim 13 wherein said variable impedance device is a light dependent resistance assembly.

15. The microphone output limiter as defined in claim 13 wherein said threshold level detector is a peak detector comprised of two comparators in a conventional window comparator configuration.

16. The microphone output limiter as defined in claim 15 wherein said window comparator has +10 volt and −10 volt window references.

17. An output limiter for controlling a microphone signal level input to a pre-amplifier having an input circuit and an output circuit, said limiter comprising:
  a. a threshold level detector connected to said output circuit of said pre-amplifier for detecting an output signal therefrom to generate a control signal whenever said output signal exceeds a preselected level;
  a variable impedance device operably connected to said threshold level detector for receiving said control signal to produce a shunt load impedance; and
  c. an impedance converter having at least two windings operably connected between said microphone and said pre-amplifier and also connected to said variable impedance device for accommodating the requirement of the input impedance of said input circuit of said pre-amplifier.

18. The microphone output limiter as defined in claim 17 wherein said variable impedance device is a light dependent resistance assembly.

19. The microphone output limiter as defined in claim 17 wherein said threshold level detector is a peak detector comprised of two comparators in a conventional window comparator configuration.

20. The microphone output limiter as defined in claim 17 wherein said impedance converter has a first winding connected to said variable impedance device output circuit and a second winding connected to said input circuit of said pre-amplifier.

21. The microphone output limiter as defined in claim 17 wherein said impedance converter has a first winding connected to said microphone and a second winding connected to said variable impedance device.

22. The microphone output limiter as defined in claim 17 wherein said impedance converter has a first winding connected to said variable impedance device, a second winding connected to said input circuit of said pre-amplifier, and a third winding connected to said microphone.

23. A microphone limiter, comprising:
  a. a microphone having an output impedance and a pair of output terminals;
  b. an impedance transformer having at least one pair of input terminals coupled to said pair of output terminals of said microphone and a pair output terminals;
  c. a pre-amplifier having an input coupled said pair of output terminals of said impedance transformer and an output;
  c. a threshold level detector coupled to said output of said pre-amplifier for generating a control signal whenever said pre-amplifier output level exceeds a predetermined level;
  d. a variable impedance device having a pair of impedance terminals coupled to said pair of output terminals of said microphone and a control input coupled to said control signal of said threshold level detector; and
  e. said variable impedance device proportionally reduces the load impedance across said microphone output terminals, consequently attenuating and limiting said microphone output level, in response to said control signal of said threshold level detector whenever said pre-amplifier output level exceeds a predetermined level.

* * * * *